United States Patent [19]

Ohtsuka et al.

[11] Patent Number: 4,725,854
[45] Date of Patent: Feb. 16, 1988

[54] LASER EMITTING APPARATUS AND LASER BEAM PRINTER USING SAME

[75] Inventors: Yasumasa Ohtsuka; Masaharu Ohkubo, both of Yokohama, Japan

[73] Assignee: Canon Kabushiki Kaisha, Tokyo, Japan

[21] Appl. No.: 872,510

[22] Filed: Jun. 10, 1986

[30] Foreign Application Priority Data

Jun. 11, 1985 [JP] Japan ............................ 60-125103

[51] Int. Cl.⁴ .................. G01D 9/42; G01D 15/14; H01S 3/13
[52] U.S. Cl. .................................. 346/108; 346/160; 372/29; 372/33
[58] Field of Search ................. 346/108, 160; 372/29, 372/32, 33, 34

[56] References Cited

U.S. PATENT DOCUMENTS 4,375,067 2/1983 Kitamura ........................ 346/160
4,639,924 1/1987 Tsunekawa ...................... 372/33

FOREIGN PATENT DOCUMENTS 120663 6/1985 Japan ................................. 346/108

Primary Examiner—E. A. Goldberg
Assistant Examiner—Patrick W. Foster
Attorney, Agent, or Firm—Fitzpatrick, Cella, Harper & Scinto

[57] ABSTRACT

An information recording apparatus includes a temperature detector for detecting the temperature of a semiconductor laser and a condition setter for generating a signal corresponding to a laser beam wavelength at a predetermined temperature. The apparatus further includes a control system for controlling a laser output of the semiconductor laser in response to the temperature detection signal from the temperature detector and the condition signal set by the condition setter.

9 Claims, 11 Drawing Figures

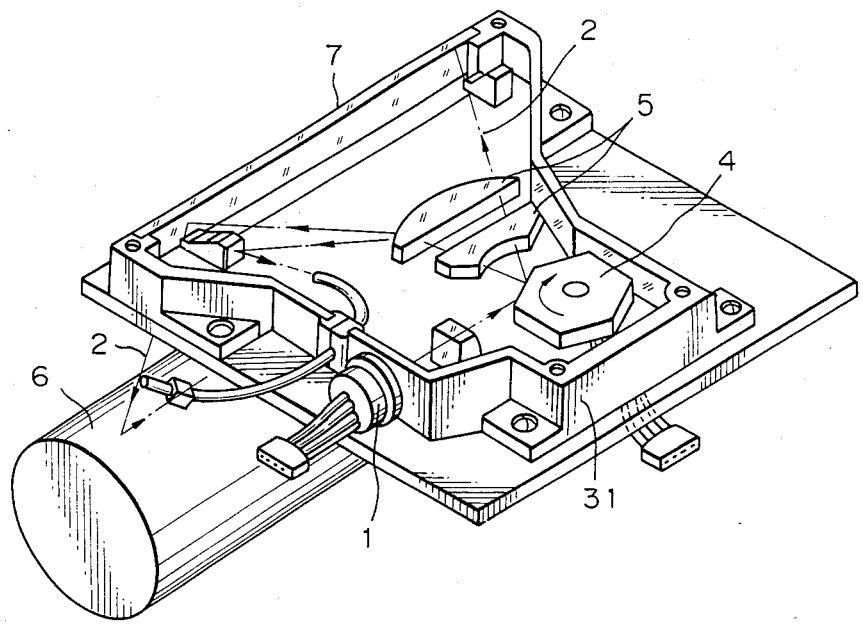
Fig. 3
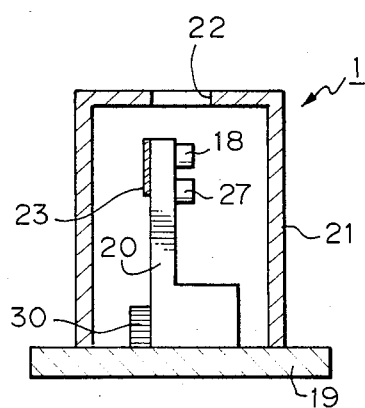
Fig. 4
Fig. 5A
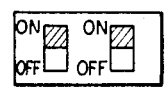
Fig. 5B
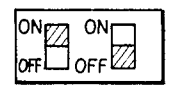
Fig. 5C
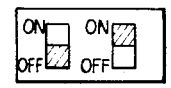

LASER EMITTING APPARATUS AND LASER BEAM PRINTER USING SAME

BACKGROUND OF THE INVENTION

1. Field of the Invention

The present invention relates to an information recording apparatus in which a photosensitive body is exposed to a beam from a semiconductor laser, driven in response to a recording signal, to record desired information.

2. Related Background Art

The shortest oscillation wavelengths of existing semiconductor lasers fall within the range of 760 to 810 nm.

An electrophotographic photosensitive body must be sensitized with infrared rays. In this case, the sensitivity of the photosensitive body varies within the semiconductor laser wavelength range. In addition, wavelengths of semiconductor lasers vary depending on semiconductor chip temperatures.

Laser wavelengths vary in response to temperature changes at a rate of 0.2 to 0.3 nm/°C. For example, if the laser chip temperature is changed from standard room temperature (i.e., 25° C.) to 35° C., the wavelength is increased by 2 to 3 nm. However, if the laser chip temperature is changed from standard room temperature to 5° C., the laser wavelength is shortened by 4 to 6 nm.

An electrophotographic photosensitive body used together with a semiconductor laser has sensitivity in the semiconductor laser oscillation wavelength range of 660 to 830 nm. The sensitivity greatly varies in the range of 760 to 810 nm (the sensitivity is decreased for a longer wavelength), as shown in FIG. 6. In FIG. 6, the wavelength is plotted along the abscissa and the relative sensitivity of the photosensitive body is plotted along the ordinate.

As is apparent from FIG. 6, the sensitivity of the photosensitive body and therefore, the surface potential of the portion of the photosensitive body irradiated with a laser beam changes greatly in accordance with changes in the wavelength of the semiconductor laser. A conventional technique has been proposed to set the laser wavelength to be constant so as to stabilize the quality of the recorded image.

In a conventional information recording apparatus using a semiconductor laser, a Peltier element which can be heated and cooled is used to maintain the laser chip temperature and its ambient temperature to be constantly 20° to 25° C. However, in order to maintain the laser chip temperature at 20° to 25° C., a voltage with positive and negative polarities and a large current are required for the Peltier element. Therefore, a bulky, large-capacity power source is required.

The Peltier element as a whole is bulky since it requires a heat sink, and the element itself is not always stable. Further, when room temperature is abruptly increased from a low to a high temperature, the area near the laser chip is maintained at 20° to 25° C., and condensation may form on the glass window of the semiconductor laser unit, scattering the output beam, thereby resulting in blurring or disturbance of the image.

The temperature characteristics of the laser wavelengths in different semiconductor lasers vary. The wavelengths of laser outputs at an identical temperature vary in different semiconductor lasers. Therefore, if a semiconductor laser mounted in an information recording apparatus is replaced with an equivalent one, image quality is often degraded.

SUMMARY OF THE INVENTION

It is an object of the present invention to provide an information recording apparatus which eliminates the above-mentioned conventional drawbacks.

According to the present invention, semiconductor laser outputs can be corrected in correspondence with variations in the temperature characteristics of the semiconductor the laser, and with changes in laser wavelengths caused by temperature changes.

The present invention relates to a laser emitting apparatus comprising a semiconductor laser, and first and second beam power setting means. The first beam power setting means adjusts the power of the laser in accordance with the wavelength of the laser beam emitting by the semiconductor laser at a predetermined temperature. The second beam power setting means adjusts the power of the laser in accordance with the temperature of the semiconductor laser.

BRIEF DESCRIPTION OF THE DRAWINGS

FIG. 3 is a perspective view of a laser optical system;

FIG. 4 is a sectional view of a laser unit;

FIGS. 5A, 5B, and 5C are views showing the states of a DIP switch;

DETAILED DESCRIPTION OF THE PREFERRED EMBODIMENT

Figure 1:
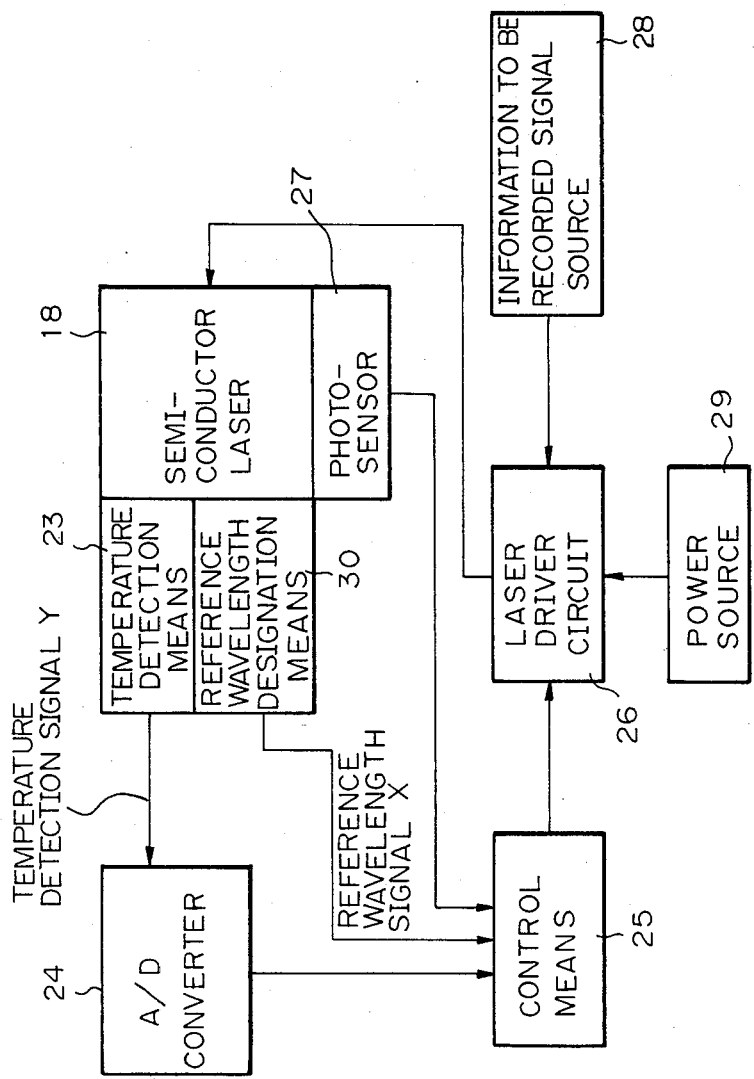
FIG. 1 is a block diagram of a semiconductor laser control system.
Figure 2:
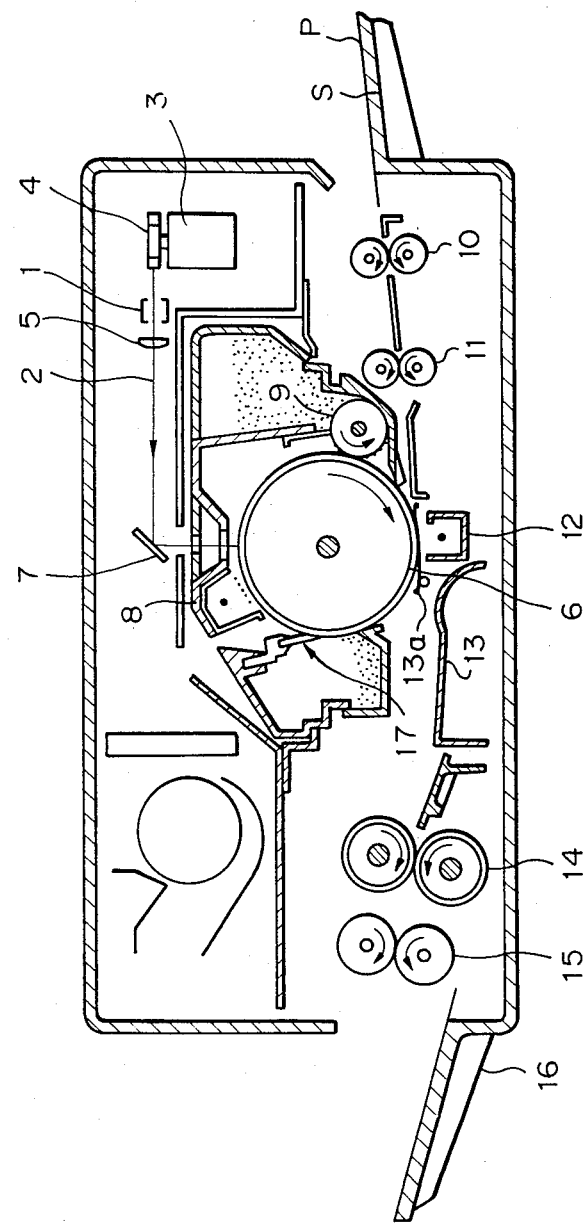
FIG. 2 is a side sectional view of a laser beam printer to which the present invention is applied.

FIGS. 1 to 5A-5C show a laser beam printer according to the present invention. The laser printer comprises a laser unit 1 incorporating a semiconductor laser 18 driven with flickering modulation in response to an information-to-be-recorded signal from an information to be recorded signal source 28 such as a computer, a wordprocessor, or a facsimile system. The semiconductor laser unit 1 is mounted in an optical box 31 shown in FIG. 3. A laser beam 2 oscillated by the semiconductor laser 18 is scanned and deflected by a polygonal mirror 4 driven by a motor 3. The laser beam 2 is focused by a lens 5 to form a beam spot on an electrophotographic photosensitive drum 6 rotated in the direction of an arrow in FIG. 2. The surface of the drum 6 is scanned with the beam spot. A mirror 7 reflects the beam 2 downwardly so that it is directed toward the drum 6.

The photosensitive body is made of a photosensitive material having sensitivity in the oscillation wavelength region of a semiconductor laser. Examples of the photosensitive material are a metal phthalocyanine-based organic photosensitive material, an amorphous silicon photosensitive material, a selenium photosensitive material, and cadmium sulfide.

The laser printer also incorporates a charger 8. The charger 8 uniformly charges the photosensitive drum 6 coated with the organic photosensitive material or the like.

The photosensitive drum 6 charged by the charger 8 is scanned with the laser beam 2 and an electrostatic latent image is formed on the drum. In this embodiment, a portion to be attached with a toner (i.e., a visible image portion) is irradiated with the laser beam. In other words, a so-called image scan method is employed in which a portion irradiated with the laser beam is developed. This is because the image scan method provides a clear image and only a short emission time is required, prolonging the service life of the semiconductor laser, when compared with the background scan system.

The latent image is visualized by a developing unit 9. Each sheet P on a sheet stacker S is fed onto the photosensitive drum 6 by register rollers 11, which rotate in synchronism with pickup rollers 10 and the image on the photosensitive drum 6. A toner image is transferred by a transfer charger 12 from the photosensitive drum 6 to the sheet P. Thereafter, the sheet P separated from the photosensitive drum 6 by a separating means 13a is guided by a guide 13 to a fixing unit 14. The toner image on the sheet P is fixed and is delivered by delivery rollers 15 onto a tray 16.

The surface of the photosensitive drum after image transfer is cleaned by a cleaning unit 17.

FIG. 4 shows the detailed arrangement of the semiconductor laser unit 1. The unit 1 comprises a base 19, a support member 20 fixed on the base 19, a semiconductor laser (chip) 18 fixed on the support member 20, and a cap 21 for covering the support member 20 and the semiconductor laser 18. The cap 21 has a glass window 22 through which the laser beam passes. The members 19, 20 and 21 (excluding the window 22) can be made of a metal (e.g., aluminum, brass, or stainless steel) having good heat conductivity.

A temperature detection means 23 such as a thermistor is arranged near the semiconductor laser 18 to detect the temperature of the semiconductor laser 18. A DIP switch 30 serves as a reference wavelength designation means, i.e., a condition setting means. The DIP switch 30 generates a reference wavelength signal for designating the emission wavelength of the semiconductor laser 18 accomodated in the cap 21 at a predetermined temperature. The DIP switch 30 can be removed together with the laser unit 1 from the optical box 31, and can be replaced with a new one. After the wavelength of the semiconductor laser 18 at room temperature of 25° C. is measured in advance, the DIP switch 30 is manually set in one of the three levels respectively shown in FIGS. 5A to 5C according to the measured value of the wavelength. A reference wavelength signal X set by the DIP switch 30 is read by a control means 25 such as a microcomputer to determine the central value of the output intensity of the semiconductor laser 18. The temperature detection means 23 is connected to an A/D converter 24. A detected temperature signal Y is supplied to the A/D converter 24. The A/D converter 24 is also connected to the control means 25 to correct output intensity of the semiconductor laser 18 in accordance with the detected temperature converted by the A/D converter 24 into a digital value. More specifically, the control means 25 is connected to a laser driver circuit 26 to control it. Therefore, the driver circuit 26 supplies a drive current corresponding to the signals X and Y to the semiconductor laser 18.

Figure 6:
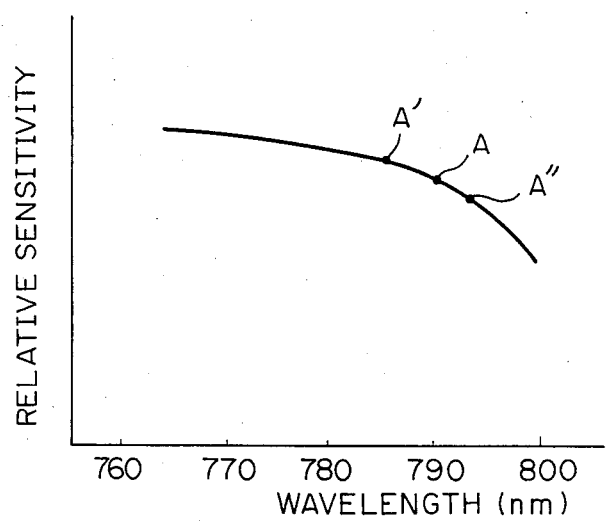
FIGS. 6 and 8 are respectively graphs showing relative sensitivity of the photosensitive drum used in the apparatus of FIG. 2.
Figure 7:
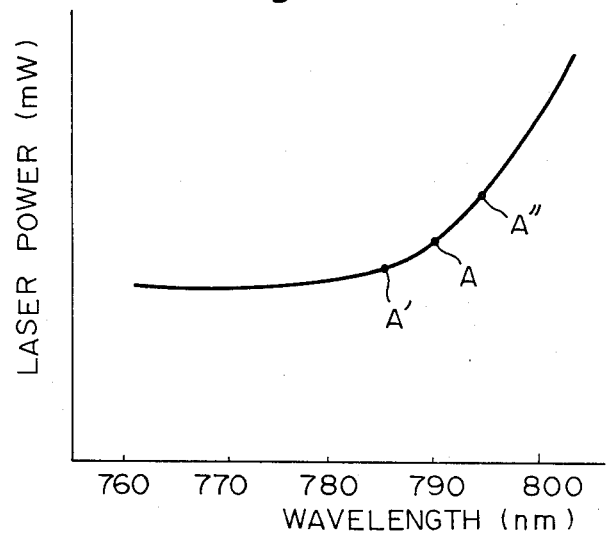
FIGS. 7 and 9 are respectively graphs showing the relationship between laser beam wavelength and laser output controlled as a function of wavelength.

In a semiconductor laser having a wavelength of 790 nm at point A (FIG. 6) at a temperature of 25° C., if the ambient temperature is decreased to 10° C., the laser wavelength is shortened by a maximum of 4.5 nm =0.3×(25° C.-10° C.), as previously mentioned. The resultant wavelength corresponds to point A'. As shown in FIG. 6, relative sensitivity of the photosensitive drum 6 is improved and a potential at the portion irradiated with the laser beam is excessively lowered. For this reason, as shown in FIG. 7, the control means 25 weakens the laser power to correct the surface potential of the photosensitive drum 6. However, if the ambient temperature is increased to 35° C., the laser wavelength is increased by a maximum of 3 nm=0.3×(35° C.-25° C.). The resultant wavelength is given by point A" in FIG. 6 and the relative sensitivity of the photosensitive drum is degraded. As a result, the surface potential of the photosensitive drum 6 is increased. The control means 25 corrects the laser drive current such that the laser power is increased up to point A" in FIG. 7.

A photosensor 27 such as a photodiode is arranged at the laser chip side opposite to the photosensitive body scanning beam output side of the laser 18. The photosensor 27 is arranged to detect the intensity of light at the rear surface of the laser chip. The control means 25 controls the laser drive current such that the light intensity at the rear surface is maintained at a constant value. In other words, the laser output is maintained at a value corresponding to the laser chip temperature, if this is kept constant.

Figure 8:
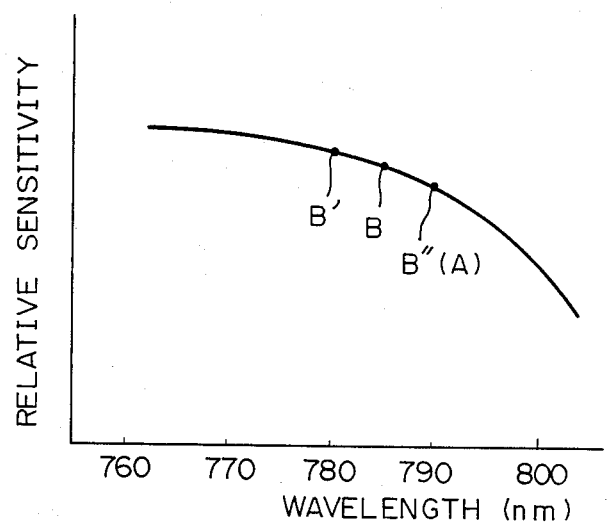
Figure 9:
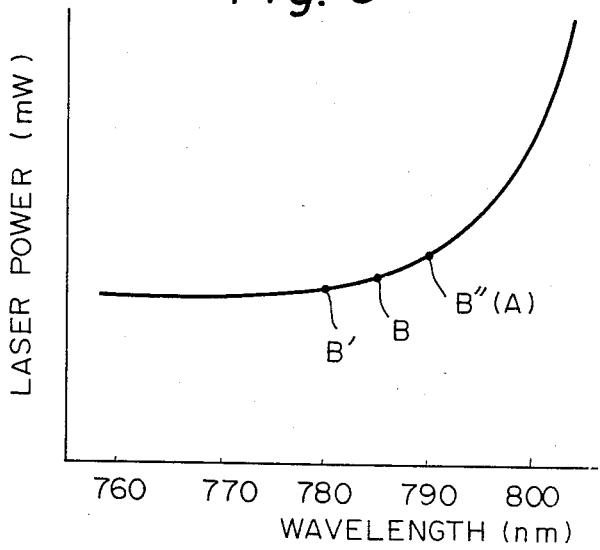

The wavelength of the semiconductor laser 18 varies in the range of 770 nm to 800 nm at a given temperature. For this reason, the wavelength of the beam from the semiconductor laser 18 at a temperature of 25° C. is measured in advance and the DIP switch 30 is set at one of the levels respectively shown in FIGS. 5A to 5C. The level in FIG. 5A corresponds to the laser beam having a wavelength of 790 nm at a room temperature of 25° C. The output level of the semiconductor laser 18 is then adjusted within the range of A' to A" according to the signal Y output from the temperature detection means 23. In the setting corresponding to point B shown in FIG. 8, the control means 25 controls the output from the semiconductor laser 18 in the range of B' to B" in accordance with the reference wavelength signal X corresponding to the semiconductor laser beam having a wavelength of 785 nm at room temperature of 25° C. and the signal Y outputted from the temperature detection means 23. In the setting states of the DIP switch 30 in FIGS. 5A to 5C, the correction of outputs as a function of the temperature of the semiconductor laser 18 is performed by storing correction curves (FIGS. 7 and 9) in the control means 25. In this case, the control means 25 selects the laser output control condition in response to the signal set by the DIP switch 30, i.e., the signal corresponding to the laser beam wavelength of the semiconductor laser. The controls means 25 control the output intensity of the laser corresponding to the semiconductor laser temperature in accordance with the selected laser output control condition. More specifically, if the laser beam wavelength varies according to predetermined semiconductor laser temperatures, the control means 25 changes the ratio of the output intensity of the semiconductor laser to a change in laser temperature. In this embodiment, the photosensitive body sensitivity is degraded at a longer wavelength of the semiconductor laser. Therefore, the control means 25 increases the ratio for a semiconductor laser generating a beam having a longer wavelength at the predetermined temperature. However, the ratio is decreased for a semiconductor laser generating a beam having a shorter wavelength at the predetermined temperature.

An information-to-be-recorded signal from the source 28 is inputted from a computer or the like to the laser driver circuit 26, and a power source 29 energizes the laser driver circuit 26.

In the above embodiment, the photosensitive body is exemplified by one having the relative sensitivity shown in FIG. 6. However, the photosensitive body may have another relative sensitivity according to the scanning density of the laser beam and variations in sensitivity in different photosensitive body lots. In this case, a plurality of correction curves are stored in the control means 25. If the difference between the relative sensitivity characteristics is caused by different scanning densities, a switch may be arranged to select the proper relative sensitivity or different control means for the respective scanning densities may be used. If the different relative sensitivity characteristics are caused by characteristic variations in different photosensitive body lots, a plurality of projections may be formed on a cartridge for setting the photosensitive drum in the laser beam printer. A predetermined microswitch on the laser beam printer housing can be turned on according to a combination of projections to select an optimal correction curve.

In the above embodiment, the reference wavelength designation means is exemplified by the DIP switch 30. However, a variable resistor may be arranged in the semiconductor laser unit 1 and a voltage applied across this resistor can be read as the reference wavelength signal X by the A/D converter 24.

What is claimed is:

1. A laser emitting apparatus comprising:
   a semiconductor laser adapted to emit a laser beam;
   first beam power setting means for adjusting the power of the laser beam in accordance with the wavelength of the laser beam emitted by said semiconductor laser at a predetermined temperature; and
   second beam power setting means for adjusting the power of the laser beam in accordance with the temperature of said semiconductor laser.

2. A laser emitting apparatus according to claim 1, wherein said first and second beam power setting means generate respective output signals corresponding to the power of the beam to be set, and wherein said apparatus further comprises control means for controlling the power of the beam on the basis of the output signals from said first and the second beam power setting means.

3. A laser emitting apparatus according to claim 1, wherein said first beam power setting means generates an output signal of reference wavelength at the predetermined temperature and comprises switch means for switching the output signal of reference wavelength between a plurality of levels, and wherein the power of said beam of the apparatus is set on the basis of the output signal of reference wavelength.

4. A laser emitting apparatus according to claim 1, wherein said second beam power setting means comprises temperature detecting means for detecting the temperature of said semiconductor laser, and wherein the power of said beam is set on the basis of the temperature detected by said detecting means.

5. A laser beam printer comprising:
   a photosensitive member;
   a semiconductor laser emitting a laser beam for irradiating said photosensitive member, said semiconductor laser being modulated in response to recorded information;
   first beam power setting means for adjusting the power of the laser beam in accordance with the wavelength of the beam emitted by said semiconductor laser at a predetermined temperature; and
   second beam power setting means for adjusting the power of the laser beam in accordance with the temperature of said semiconductor laser.

6. A printer according to claim 5, wherein said first and second beam power setting means generate respective output signals corresponding to the power of the beam to be set, and wherein said printer further comprises control means for controlling the power of the beam on the basis of the output signals from said first and the second beam power setting means.

7. A printer according to claim 5, wherein said first beam power setting means generates an output signal of reference wavelength at the predetermined temperature and comprises switch means for switching the output signal of reference wavelength between a plurality of levels, and wherein the power of the beam of said printer is set on the basis of the output signal of reference wavelength.

8. A printer according to claim 5, wherein said second beam power setting means comprises temperature detecting means for detecting the temperature of the semiconductor laser, and wherein the power of the beam is set on the basis of the temperature detected by said detecting means.

9. A printer according to claim 5, wherein the relative sensitivity of said photosensitive member diminishes as the wavelength increases in a wavelength change region due to the temperature of the beam outputted from the semiconductor laser, and wherein said second beam setting means sets the beam power at a high level when the temperature of the semiconductor laser is higher than the predetermined temperature and wherein said second beam power setting means sets the beam power at a low level, lower than said high level, when said temperature is lower than the predetermined temperature.

* * * * *

UNITED STATES PATENT AND TRADEMARK OFFICE
CERTIFICATE OF CORRECTION

PATENT NO. : 4,725,854
DATED : February 16, 1988
INVENTOR(S) : YASUMASA OHTSUKA, ET AL.

It is certified that error appears in the above-identified patent and that said Letters Patent is hereby corrected as shown below:

COLUMN 2
    Line 11, "the" (first occurrence) should be deleted and "in laser" should read --in the laser--; and
    Line 18, "ting" should be --ted--.

COLUMN 3
    Line 43, "accomodated" should read --accommodated--; and
    Line 58, "output" should read --the output--.

COLUMN 4
    Line 45, "room" should read --a room--; and
    Line 56, "trols" should read --trol-- and "control" should read --controls--.

COLUMN 6
    Line 29, "the" should be deleted.

Signed and Sealed this

Thirteenth Day of September, 1988

Attest:

DONALD J. QUIGG

Attesting Officer      Commissioner of Patents and Trademarks